United States Patent [19]
Herchner

[11] 3,988,642
[45] Oct. 26, 1976

[54] ELECTRONIC CUT OUT FOR A CIRCUIT TO BE PROTECTED

[75] Inventor: Dieter Herchner, Heilbronn, Germany

[73] Assignee: Licentia Patent-Verwaltungs-G.m.b.H., Frankfurt am Main, Germany

[22] Filed: Jan. 20, 1975

[21] Appl. No.: 542,276

[30] Foreign Application Priority Data
Feb. 1, 1974 Germany............................ 2404850

[52] U.S. Cl. .............................. 317/27 R; 317/33 R; 330/207 P
[51] Int. Cl.² .......................................... H02H 3/28
[58] Field of Search ....................... 317/27 R, 33 R; 330/207 P

[56] References Cited
UNITED STATES PATENTS
3,480,852   11/1969   Hung................................ 317/33 R
3,761,775   9/1973    Ozawa et al. .................... 317/33 R

*Primary Examiner*—Harry Moose
*Attorney, Agent, or Firm*—Spencer & Kaye

[57] ABSTRACT

An electronic cut out for a circuit to be protected comprises a measuring resistor connected across the d.c. load voltage of the circuit, a differential amplifier also connected across the measuring resistor and a switch stage connected thereafter controlling a current source drive a response to the switch stage to feed current to the circuit to be protected to disconnect it.

10 Claims, 1 Drawing Figure

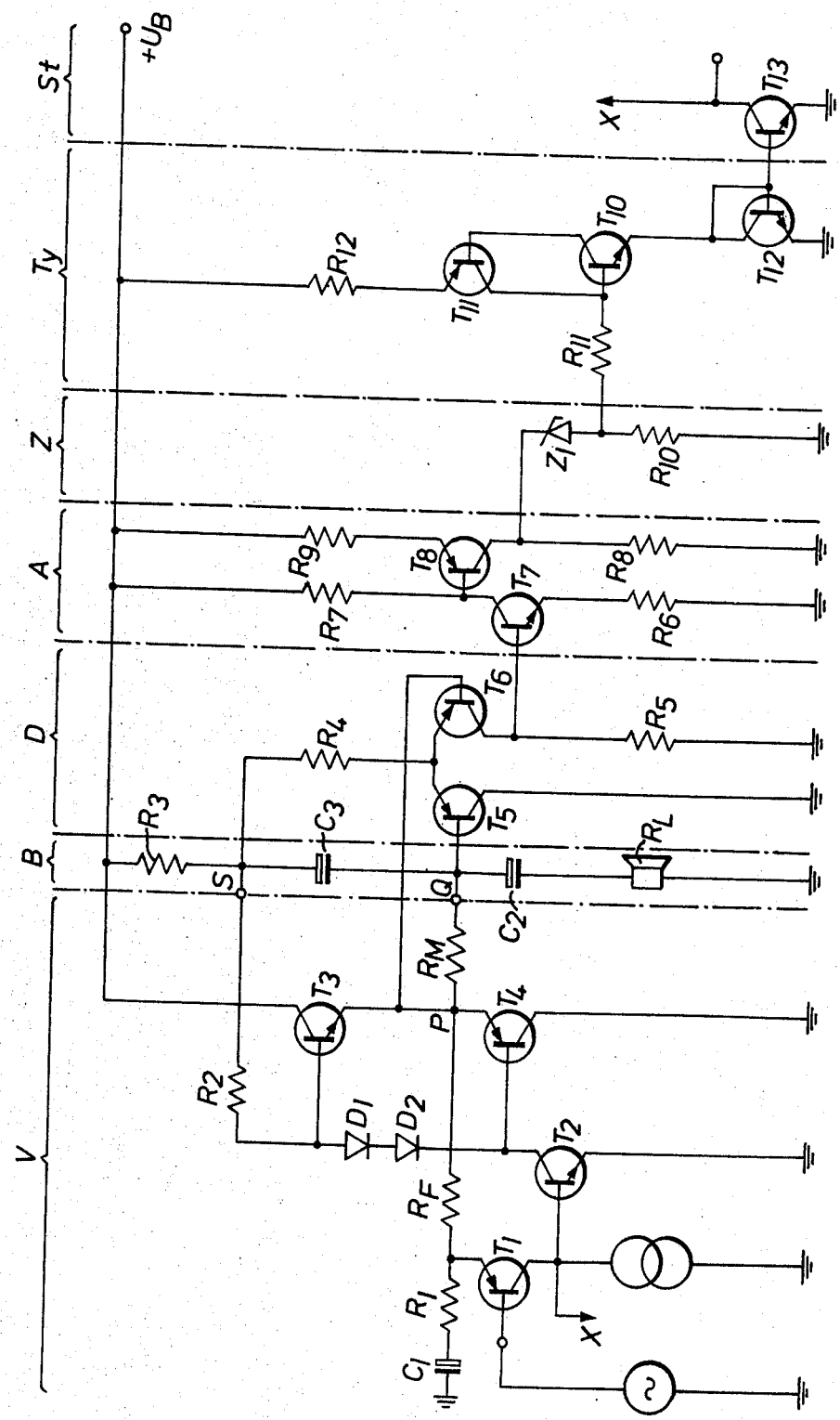

ELECTRONIC CUT OUT FOR A CIRCUIT TO BE PROTECTED

BACKGROUND OF THE INVENTION

The invention relates to an electronic cut out for a circuit to be protected, such as an amplifier circuit, as a protection against a too high a load current, wherein the load current, on exceeding a limit value, is used directly for the disconnection. This load current is converted by a suitable circuit into a proportional voltage.

Since the internal resistance of, for example, multistage low-frequency amplifier circuits is supposed to be very low for dynamic reasons, the load current taken out can assume inadmissibly high values in the case of ballast resistances which are too small. In order to avoid the destruction of last stage transistors by load currents which are too high, the use of fine fuses has already been proposed. The protection thus obtained however is incomplete, since the disconnection time of the fine fuses is, in general, large.

SUMMARY OF THE INVENTION

It is an object of the invention to provide an electronic cut out which causes the disconnection of the circuit or amplifier at a predetermined load current. Since the load current is used directly for the formation of the test value and not say the base current of the end stage transistors or of a preceding transistor-leakage, which are given for example by the difference of the current amplification factors, are eliminated.

According to the invention, there is provided an electronic cut out for a circuit to be protected comprising a measuring resistor in a load circuit of said circuit to be protected with the output direct voltage of the circuit there across, a differential amplifier connected across said measuring resistance, a switch stage connected after said differential amplifier for producing an output when the load current of said circuit exceeds a predetermined threshold value and a current source, driven in response to the output from said switch stage to feed current to said circuit to disconnect it.

Further according to the invention there is provided an electronic cut out for an amplifier circuit as protection against too high a load current, in which, for the disconnection, a load current exceeding a limit value is used directly, characterized in that a differential amplifier of at least two transistors is provided, the control electrodes of which are connected to two terminals of a measuring resistance lying in a load current circuit, in that said measuring resistance is so connected that the output direct voltage of the amplifier is applied across its two terminals, in that transistors of said differential amplifier are connected via a common dropping resistance to a potential, which varies in-phase with the dynamic output potential of the amplifier, in that said differential amplifier is connected via an adaptation stage to a switch stage, by which, on exceeding a defined threshold value, at the output of the switch stage, one or more subsequently connected current sources are driven, which are connected to said amplifier circuit in such a manner that the latter is disconnected at an excessive load current.

BRIEF DESCRIPTION OF THE DRAWING

The invention will now be described in greater detail, by way of example, with reference to the drawing, the single FIGURE of which is a circuit diagram of one form of circuit incorporating an electronic cut out in accordance with the invention.

DESCRIPTION OF THE PREFERRED EMBODIMENT

Basically the invention proposes, in the case of a circuit of the type described at the outset, that a differential amplifier of at least two transistors is provided, the control electrodes of which are connected to the two terminals of a measuring or precision resistance lying in the load current circuit, that this resistance is so connected that the output direct voltage of the amplifier is applied across its two terminals, that the transistors of the differential amplifier are connected via a common emitter dropping resistance to a potential which varies in-phase with the dynamic output potential of the amplifier, that the differential amplifier is connected via an adaptation stage to a switch stage, through which, when a predetermined threshold value is exceeded at the input of the switch stage, one or more subsequently connected current sources are driven, which is connected to the amplifier circuit in such a manner that the latter is disconnected in the case of an excessive load current.

In the case of an advantageous further form of the circuit in accordance with the invention, a current source is provided which is capable of operating at any supply direct voltage applied to the base/emitter forward voltage $U_{BE}$ of a transistor. This has the advantage that no allowance has to be made for the voltage value applied at the output electrode of the current source and predetermined by the point of connection in the amplifier circuit. Such a current source is, for example, a transistor which is connected after the switch stage.

The amplifier circuit is preferably connected to a circuit part which operates according to the principle of a bootstrap circuit. Due to this circuit part, the potential applied to the connection point of the emitter resistance of the differential amplifier is boosted to the same dynamic potential as the output voltage of the amplifier. This boosted potential is, if necessary, connected via a resistance to the output electrode of the driving transistor in the amplifier circuit so that a complete cut off of the amplifier circuit is possible.

The circuit in accordance with the invention has the advantage that the load current limit value provided for the triggering of the cut out is independent of temperature. This is achieved by the use of a differential amplifier.

The output resistance of the fuse is highly resistive in the desired manner. This follows from the highly resistive collector internal resistance of the connecting transistor forming the current source.

When the load current limit value is exceeded, the amplifier can only be set into operation again if the supply voltage is first disconnected and then reconnected. This is achieved in the case of a preferred form of embodiment of the circuit in that when a certain threshold value is exceeded a thyristor is ignited.

The transistor forming the current source is so connected to this thyristor that this transistor is driven if a limited current flows through the transistor. The thyristor receives its ignition voltage from a Zener diode which determines the threshold value. The thyristor current can only be interrupted by the supply voltage being disconnected.

The load current causes a voltage occurring at the output electrode of the differential amplifier which has a direct voltage and an alternating voltage part. The threshold value is, for the sake of simplicity, determined by a Zener diode. Now it is understandable that the threshold value of the Zener diode does not correspond absolutely to the direct voltage and alternating voltage drop at the output of the differential amplifier in the case of the load current limit value. Therefore an adaptation stage must be connected between the Zener diode and the differential amplifier. This adaptation stage, which is also called a sliding level, permits the adaptation of the direct voltage and indirect voltage parts independently of each other.

Referring now to the drawing, there is shown a circuit which substantially comprises 8 parts. The first part is the amplifier circuit V of conventional type, which comprises a plurality of stages and is used particularly for low-frequency amplifications.

The amplifier comprises the transistors $T_1$, $T_2$, $T_3$ and $T_4$ with the associated diodes $D_1$, $D_2$ between the control electrodes of the end stage transistors $T_3$ and $T_4$. These two diodes act as a voltage source and ensure a temperature-stabilised direct voltage operating point adjustment for the end stage transistors. The transistors $T_3$ and $T_4$ are complementary transistors and operate in collector circuit. The two transistors are so connected in series between the terminals of the supply voltage source $U_B$ that the emitter electrodes of both transistors are connected together and thus are at the same potential. In the operation of the circuit, an equilibrium is set up in such a manner that half the supply voltage $U_B/2$ is applied at point P between the two transistors $T_3$ and $T_4$. Since the alternating voltage amplification from the base to the emitter electrode of the end stage transistors $T_3$, $T_4$ is smaller than 1, with completely symmetrical cut off of the driver transistor, for which there is also available only the supply voltage $U_B$, the complete alternating voltage amplitude $$\hat{U} = \frac{U_B}{2}$$

is not applied at the output P of the end stage transistors. It is therefore necessary to boost the output potential of the driver stage in the case of an input signal which is in-phase with the output voltage at P to such an extent that the amplifier can be completely cut off.

The boosting of the collector potential of the driver transistor $T_2$ is effected with the help of the switch elements $C_3$, $R_3$ in the circuit part B, which operates according to the principle of a bootstrap circuit. The load circuit, which is connected via the measuring resistance $R_M$ to the point P of the amplifier is also contained in this circuit part. The second terminal Q of the measuring resistance $R_M$ is connected via the capacitor $C_2$ and the ballast resistance $R_L$ to the negative terminal ro to the earth connection and via a further capacitance $C_3$ and the resistance $R_3$ to the positive terminal of the supply voltage source. The connection S between the capacitance $C_3$ and the resistance $R_3$ is connected, on the one hand, via the resistance $R_2$ to the collector electrode of the transistor $T_2$ and, on the other hand, via the emitter dropping resistance $R_4$ of the two emitter electrodes of transistors $T_5$ and $T_6$ of a differential amplifier D. The base electrode of the transistor $T_5$ is connected to Q, while the base electrode of the transistor $T_6$ is connected to P.

As long as no alternating current signal is present, $R_M$ is practically free of direct voltage and is thus currentless, since a direct current can neither flow via $C_2$ nor $C_3$ and the base current of the transistor $T_5$ is negligibly small. Thus Q is at the direct voltage potential $U_B/2$ coinciding with P. The load current flows via $R_M$ with the occurrence of an alternating current signal and a connected ballast resistance RL. At the same time, the potential at the point S via the capacitance $C_3$ is varied in such a manner that even a complete cut off of the output transistors $T_3$ and $T_4$ is possible up to the voltage $U_B/2$.

The construction of the differential amplifier D connected to the measuring resistance $R_M$ has already been described extensively. The collector of the transistor $T_5$ is connected directly to earth, whereas the collector of the transistor $T_6$ is connected to earth via the collector resistance $R_5$.

Then a certain direct voltage drops across $R_5$, on which direct voltage is superimposed an alternating voltage which is dependent on the load current measured at $R_M$. $R_M$ can be chosen to be infinitely small in practice, since the voltage value tapped at $R_M$ is amplified at the differential amplifier D and this amplified value can be transformed further via an adaptation stage to the desired value.

The adaptation stage A comprises the two complementary transistors $T_7$ and $T_8$. The emitter electrode of $T_7$ is connected via the emitter resistance $R_6$ to earth and the collector is connected via the collector resistance $R_7$ to the positive terminal of the supply voltage source. The complementary transistor $T_8$, the base electrode of which leads to the collector electrode of $T_7$, is however connected via a collector resistance $R_8$ to earth and via an emitter resistance $R_9$ to the positive terminal of the supply voltage source. The adapted voltage is formed at $R_8$, which voltage switches through the subsequently connected Zener diode $Z_1$ on exceeding a limit value.

In the case of an adaptation stage of the type described the following equations apply:

$$\frac{R_8}{R_9} = V_u \left(\frac{U_{in}}{U_{BE}} - 1\right) - \frac{U_{out}}{U_{BE}} \quad (1)$$

and $$\frac{R_7}{R_6} = V_u \cdot \frac{R_9}{R_8} \quad (2)$$

In this case $V_u$ is the alternating voltage amplification of the adaptation stage, thus $V_u = V_7 \cdot V_8$, wherein $V_7$ and $V_8$ are the amplification factors of the two stages with the transistors $T_7$ and $T_8$. $U_{out}$ is the desired direct voltage at $R_8$, while $U_{in}$ is the direct voltage at $R_5$.

If it is assumed that the Zener diode $Z_1$ has a Zener voltage of 5.5 volts, then it is ensured by the adaptation stage that this Zener voltage drops across $R_8$ in the case of the desired load current limit value. If a direct voltage of 2 volts drops across $R_5$, for example, then $U_{out}$ has, for example, a direct voltage value of 4 volts in the above equation. Up to the Zener voltage of 5.5 volts, there then still remains 1.5 volts. If, in the case of the load current limit value, an alternating voltage across $R_5$ drops with the peak value 0.5 volts, $V_u$ must have the value 3, so that the still missing 1.5 volts are obtained at $Z_1$. If the values for $V_u$ and $U_{out}$ are selected thus, there results therefrom with equation (1) the resistance ratio $R_8/R_9$ and thus from equation (2) also the resistance ratio $R_7/R_6$.

The series circuit Z of the Zener diode $Z_1$ and the resistance $R_{10}$ is connected in parallel with the output resistance $R_8$ of the adaptation stage A.

Thus the Zener voltage then fails at the Zener diode $Z_1$ if the load current limit value is achieved. The tyristor connected to the Zener diode $Z_1$ is then ignited by the transistors $T_{10}$ and $T_{11}$. This thyristor current in the thyristor switch part $T_y$ is limited by the resistance $R_{12}$ connected in series with the thyristor. It produces at the transistor $T_{12}$, likewise connected in series, a voltage drop of the value $U_{BE}$. In the case of this voltage, the subsequently connected transistor $T_{13}$ serving as a current source is always driven if the voltage at the collector electrode of $T_{13}$ lies between the values $U_{BE}$ and $U_B$, wherein $U_B$ is the direct voltage supply. The current source can therefore be connected almost to any point whatever of the amplifier circuit. The collector of $T_{13}$ is, for example, connected to the base electrode of the driver transistor $T_2$. If the load current limit value is achieved, the transistor $T_{13}$ is driven and the base current of the transistor $T_2$ is derived. The amplifier disconnects and can be put into operation only by a disconnection and reconnection of the direct voltage supply once more. The transistor is connected, for example, as a diode. The current source St is connected to the short-circuited collector-base path. Also a plurality of current source transistors can be connected in series in many cases.

The transistor $T_{13}$ can also be connected, for example, to the input electrode of $T_3$ or $T_4$ or to the emitter electrode of $T_1$.

It should be further mentioned that the resistance $R_3$ is very much greater than the resistance $R_1$ in order to keep the alternating current flowing away via $R_3$ small.

In the case of the exemplary embodiment shown, $T_1$, $T_4$, $T_5$, $T_6$, $T_8$ and $T_{11}$ are pnp transistors, whereas the other transistors are npn transistors.

The circuit can be accommodated in one or more semi-conductor bodies as an integrated solid state circuit. Then the low resistivity measuring resistance $R_M$ is realized preferably by a conducting path or a diffused resistance.

It will be understood that the above description of the present invention is susceptible to various modifications changes and adaptations.

What is claimed is:

1. An electronic cut out for an amplifier circuit as protection against too high a load current, in which, for the disconnection, a load current exceeding a limit value is used directly, characterized in that a differential amplifier of at least two transistors is provided, the control electrodes of which are connected to two terminals of a measuring resistance lying in a load current circuit, in that said measuring resistance is so connected that the output direct voltage of the amplfier is applied across its two terminals, in that transistors of said differential amplifier are connected via a common dropping resistance to a potential, which varies in-phase with the dynamic output potential of the amplifier, in that said differential amplifier is connected via an adaptation stage to a switch stage, by which, on exceeding a defined threshold value, at the output of the switch stage, one or more subsequently connected current sources are driven, which are connected to said amplifier circuit in such a manner that the latter is disconnected at an excessive load current.

2. An electronic cut out as defined in claim 1, and comprising a current source which is capable of operating on any supply direct voltage applied via the base-emitter forward direction of a transistor.

3. An electronic cut out as defined in claim 1, and comprising a circuit part operating according to the principle of a bootstrap circuit, by which part circuit the said potential applied to the connection point of said emitter dropping resistance of said differential amplifier is boosted to the same dynamic potential as the output voltage of said amplifier with this potential connected to the output electrode of a driver transistor of said amplifier.

4. An electronic cut out as defined in claim 1, wherein said measuring resistance is of low value.

5. An electronic cut out as defined in claim 1, wherein said adaptation stage comprises first and second complementary transistors connected one after the other with the emitter electrode of said first transistor is connected via an emitter resistance to a first terminal of voltage supply source and the collector electrode of said first transistor is connected via a collector resistance ($R_7$) to a second terminal of said voltage supply source, and with the emitter electrode of said second transistor is connected via an emitter resistance to said second terminal of said voltage supply source and the collector electrode of said second transistor via a collector dropping resistance to said first terminal of said supply voltage source.

6. An electronic cut out as defined in claim 5, and comprising a circuit part for determining said threshold value including a series circuit of a Zener diode and a resistance, is connected in parallel with the collector resistance of said second transistor of said adaptation stage.

7. An electronic cut out as defined in claim 6, and comprising a thyristor connected to said Zener diode, and ignited on exceeding a certan threshold value, a transistor forming a said current source connected after said thyristor and driven when said thyristor is switched through, the collector electrode of said transistor forming a said current source being connected at one point of said amplifier circuit to disconnect said amplifier circuit when a maximum admissible load current is exceeded.

8. An electronic cut out as defined in claim 1 and comprising a circuit realized in one or more semiconductor bodies as an integrated solid state circuit.

9. An electronic cut out as defined in claim 8, wherein the measuring resistance is realized in the integrated circuit by a conducting path running on the surface of the semiconductor body or by a diffused low value resistance.

10. An electronic cut out as defined in claim 8, wherein the measuring resistance is realized in the integrated circuit by a diffused lower value resistance.

* * * * *